United States Patent
Moon et al.

(10) Patent No.: US 6,838,330 B2
(45) Date of Patent: Jan. 4, 2005

(54) METHOD OF FORMING A CONTACT HOLE OF A SEMICONDUCTOR DEVICE

(75) Inventors: Bong-Ho Moon, Suwon-si (KR); Ju-Yun Cheol, Seoul (KR); Yong-Sun Ko, Suwon-si (KR); In-Seak Hwang, Suwon-si (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/445,843

(22) Filed: May 28, 2003

(65) Prior Publication Data

US 2004/0121590 A1 Jun. 24, 2004

(30) Foreign Application Priority Data

Jul. 9, 2002 (KR) .................................. 10-2002-39816

(51) Int. Cl.⁷ .......................................... H01L 21/8238
(52) U.S. Cl. ...................... 438/230; 438/303; 438/595; 438/639
(58) Field of Search ................................ 438/230, 303, 438/595, 618, 639

(56) References Cited

U.S. PATENT DOCUMENTS

| 6,039,815 A | * | 3/2000 | Yeol et al. | ..................... | 134/2 |
| 6,083,828 A | * | 7/2000 | Lin et al. | ..................... | 438/639 |
| 6,322,954 B1 | * | 11/2001 | Li | ............................. | 430/313 |

FOREIGN PATENT DOCUMENTS

KR  2002-15168  2/2002

* cited by examiner

*Primary Examiner*—Hsien-Ming Lee
(74) *Attorney, Agent, or Firm*—Lee & Sterba, P.C.

(57) ABSTRACT

A method of forming a contact hole of a semiconductor device that is able to prevent excessive etching of an interlayer dielectric pattern includes forming a gate pattern including a first insulation layer pattern, a conductive layer pattern, a capping insulation layer pattern, and a second insulation layer pattern on a substrate; forming a spacer using an insulating material on a sidewall of the gate pattern; forming an interlayer dielectric on the substrate on which the gate pattern and the spacer are formed; forming a contact hole and an interlayer dielectric pattern for exposing the substrate by etching the interlayer dielectric; forming a liner spacer on a sidewall of the spacer and the interlayer dielectric pattern; and cleaning the resultant structure using a cleaning solution. The cleaning solution preferably includes includes ozone water and hydrogen fluoride (HF).

13 Claims, 9 Drawing Sheets

METHOD OF FORMING A CONTACT HOLE OF A SEMICONDUCTOR DEVICE

BACKGROUND OF THE INVENTION

1. Field of the Invention

The present invention relates to a method of forming a contact hole of a semiconductor device. More particularly, the present invention relates to a method of forming a contact hole of a semiconductor device that is able to reduce a generation of a defect due to an overetching of an interlayer dielectric layer during a cleaning process after the formation of the contact hole.

2. Description of the Related Art

Recently, the design of semiconductor devices has made rapid progress as information media, such as computers, become widely used. In particular, this progress has required semiconductor devices to function at a high operating speed and to have a large storage capacitance. In order to satisfy these requirements, semiconductor devices with increased density, reliability, and response time are under development. To increase an integration degree, a cell size should be reduced, and according to the reduction of the cell size, the size and margin of all types of patterns formed on a semiconductor substrate should similarly be reduced. On the other hand, the aspect ratio of each component comprising the semiconductor device gradually increases.

A polysilicon gate structure having a good electric characteristic, reliability and integration degree has been adopted as a driving device since the initial very large scale integration (VLSI). Therefore, the polysilicon gate structure has been largely advanced in an industrial field, such as a large scale integration (LSI) for a micro-computer or a device of a high-density memory, and is widely used in various fields today. Since the melting point of polysilicon is high, a self-align method can be applied during formation of a gate electrode along with a diffusion region of source and drain when using polysilicon. In addition, after patterning the gate electrode using polysilicon, a thermal oxidation of polysilicon also can be applied. Accordingly, damage generated at an edge portion of the gate electrode due to a reactive ion etching can be compensated. In addition, when an electric voltage is applied to the gate electrode, a high fringe electric field at the edge portion of the gate electrode is lowered to increase reliability of the semiconductor device.

However, for minute devices having a design rule of about 1 µm or less, an effect of increasing an operating speed of the devices through the increasing of the integration degree is not obtainable for a polysilicon gate structure. In addition, an increase in a wiring resistance through a reduction of the design rule and an increase in a signal transfer delay through the reduction of the wiring pitch and the increase in the capacitance, become significant issues. Further, a device frequency characteristic is deteriorated because the polysilicon gate structure has a relatively high resistance as compared to other conductive materials.

Accordingly, silicide compounds having similar characteristics with polysilicon while having a resistance ten times lower than polysilicon and having a high melting point are applied as a new material for forming a gate electrode. Typically, tungsten silicide is used as the silicide compound.

In addition, the design rule of recently developed and highly integrated semiconductor devices has been reduced to about 0.15 µm or less. In accordance with the reduction of the design rule, the size of a contact hole that is an electrically contacting portion to silicon is gradually reduced. A buried contact (BC) processing margin for an electrical contact of a storage node with a source/drain region of a transistor also is largely limited. Accordingly, a self-align method is widely used in order to confirm the BC processing margin. In addition, a spacer is formed on the sidewall portion of the gate electrode to prevent a contact between the storage node and the gate electrode. However, as the design rule is gradually reduced, the confirmation of the BC processing margin becomes problematic.

A conventional method of forming a contact hole of a semiconductor device by the self-align method will now be described with reference to the attached drawings in detail below.

FIGS. 1A to 1E illustrate cross-sectional views of stages in a conventional method of forming a contact hole of a semiconductor device according to the prior art. The following is an example of a BC processing.

Figure 1A:
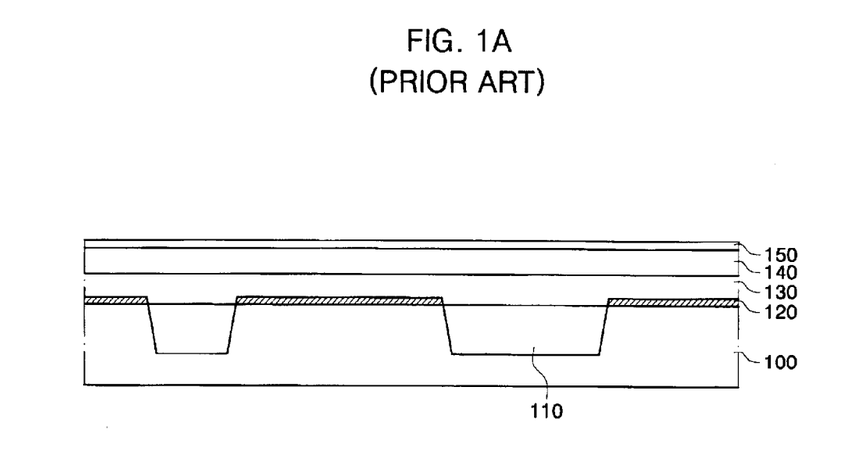
FIGS. 1A to 1E illustrate cross-sectional views of stages in a conventional method of forming a contact hole of a semiconductor device according to the prior art.

Referring to FIG. 1A, a first oxide layer 120 is formed on an active region of a semiconductor substrate 100, such as a silicon substrate, using a thermal oxidation method. The semiconductor substrate 100 is divided into an active region and a field region by a field oxide layer 110 having a thickness of about 1800–2000 Å. Next, a conductive layer 130 and a capping insulation layer 140 are sequentially formed on the semiconductor substrate 100, on which the first oxide layer 120 is formed. The conductive layer 130 is either a doped polysilicon layer or a polycide layer. As the conductive layer 130, the polycide layer includes a doped polysilicon layer having a thickness of about 800–1200 Å and a refractory metal silicide layer having a thickness of about 1300–1700 Å. As the refractory metal silicide layer, a tungsten silicide (WSix) layer, a tantalum silicide (TaSi$_2$) layer, a titanium suicide (TiSi$_2$) layer, a cobalt silicide (CoSi$_2$) layer, a molybdenum silicide (MoSi$_2$) layer, or the like are widely applied.

The capping insulation layer 140 is preferably comprised of silicon nitride, which has a high etching selectivity with respect to an oxide layer. As the capping insulation layer 140, the silicon nitride layer is formed by depositing a nitride compound such as silicon nitride (SiN) to a thickness of about 800–1200 Å by means of a plasma enhanced chemical vapor deposition method (PE-CVD). The capping insulation layer 140 functions to protect the conductive layer 130 during the performance of subsequent etching and ion implantation processes.

A second oxide layer 150 is formed on the capping insulation layer 140. The second oxide layer 150 is formed by depositing a hot temperature oxide (HTO), such as silicon oxide, to a thickness of about 800–1200 Å by means of a low pressure chemical vapor deposition method (LPCVD). The second oxide layer 150 functions as an etch stop during the subsequent performance of an etching process for forming a spacer.

Figure 1B:
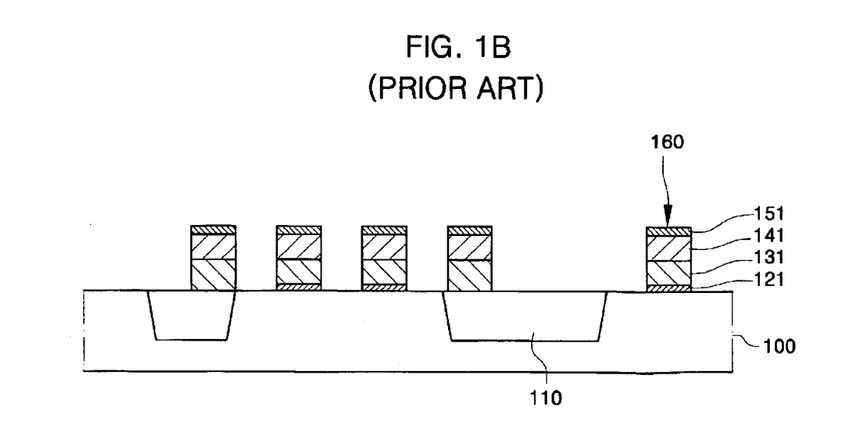

Referring to FIG. 1B, photoresist is coated on the second oxide layer 150 to form a photoresist layer. Next, a photoresist pattern (not shown) for forming a gate electrode is formed by photolithography. Then, the second oxide layer 150, the capping insulation layer 140, the conductive layer 130 and the first oxide layer 120 are continuously patterned using the photoresist pattern as an etching mask to form parallel gate patterns 160 having a gap therebetween on a predetermined region of the substrate. Each of the gate patterns 160 includes a subsequently integrated first oxide layer pattern 121, conductive layer pattern 131, capping insulation layer pattern 141 and second oxide layer pattern 151. The gate patterns 160 correspond to gate electrodes.

Figure 1C:
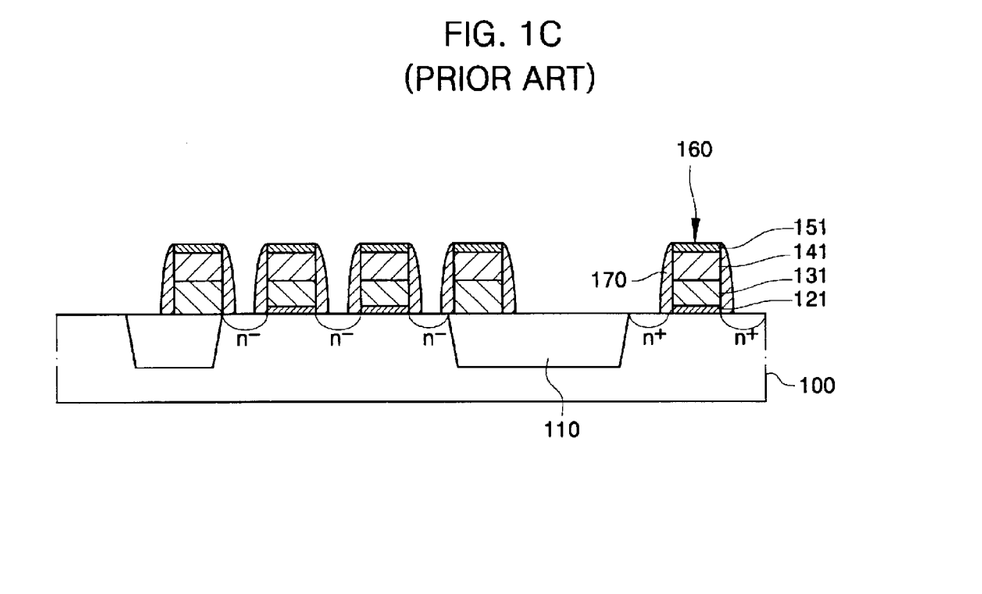

Referring to FIG. 1C, silicon nitride is deposited on the entire surface of the semiconductor substrate 100, on which the gate pattern 160 is formed, to form silicon nitride layer (not shown) as an insulation layer to a thickness of about 1200 Å. Then, an etch-back process is carried out until an active region of the semiconductor substrate 100 is exposed thereby forming a spacer 170 on a sidewall portion of the gate pattern 160.

During the etching to form the spacer 170, a surface portion of the semiconductor substrate is damaged. To cure the etching damage, a thermal oxidation is performed at a predetermined temperature. At this time, a thin thermal oxide layer grows between the gate patterns 160 and on the surface of the semiconductor substrate 100. The thermal oxidation layer that is formed is called a MTO (medium temperature oxide).

An ion implantation process is then performed to form a source/drain region (not shown) between gate patterns 160 and onto the semiconductor substrate 100 using the thin thermal oxide layer as a screen oxide layer. In order to perform the ion implantation, a region is masked to implant appropriate impurities into a desired region. Then, the impurities are implanted into the active region of the exposed semiconductor substrate 100 and a diffusion region of the source/drain of a transistor is formed. During the ion implantation, the gate electrode 160 and the spacer 170 formed at the sidewall portion of the gate electrode 160 function as the mask.

Figure 1D:
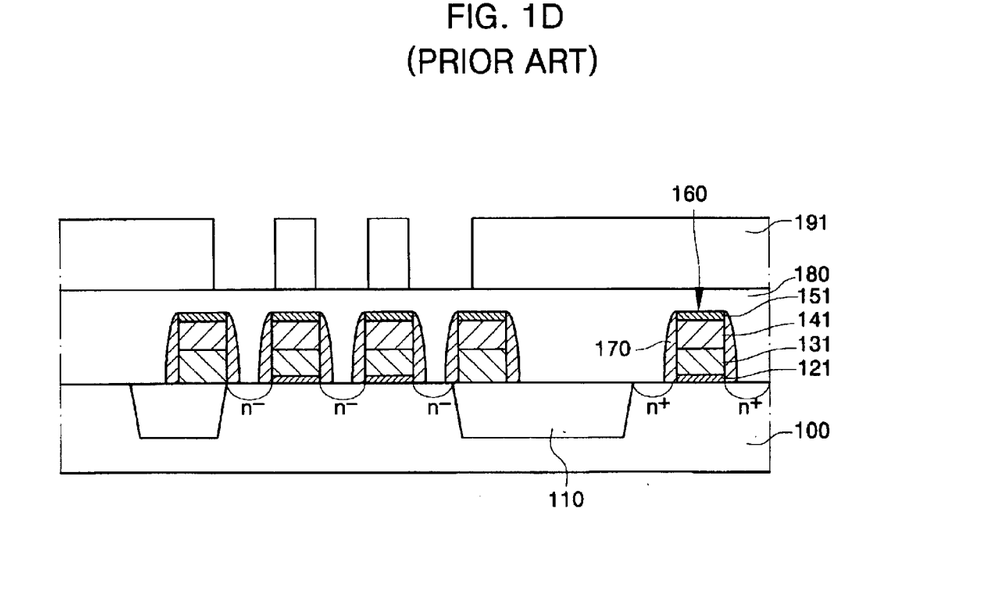

Referring to FIG. 1D, an interlayer dielectric 180 is formed on the semiconductor substrate 100 on which the gate electrode 160 and the spacer 170 are formed. The interlayer dielectric 180 is formed by depositing materials having a good gap filling characteristic, such as silicon oxide, borophosphorous silicate glass (BPSG), phosphorous silicate glass (PSG), high density plasma (HDP) oxide, tetraethyl ortho silicate (TEOS), or the like by an LPCVD method or a PE-CVD method and then, planarizing the deposited material by a planarizing method such as a chemical mechanical polishing (CMP). Next, a photoresist pattern 191 having a predetermined shape for patterning the interlayer dielectric and to form a contact hole is formed.

Figure 1E:
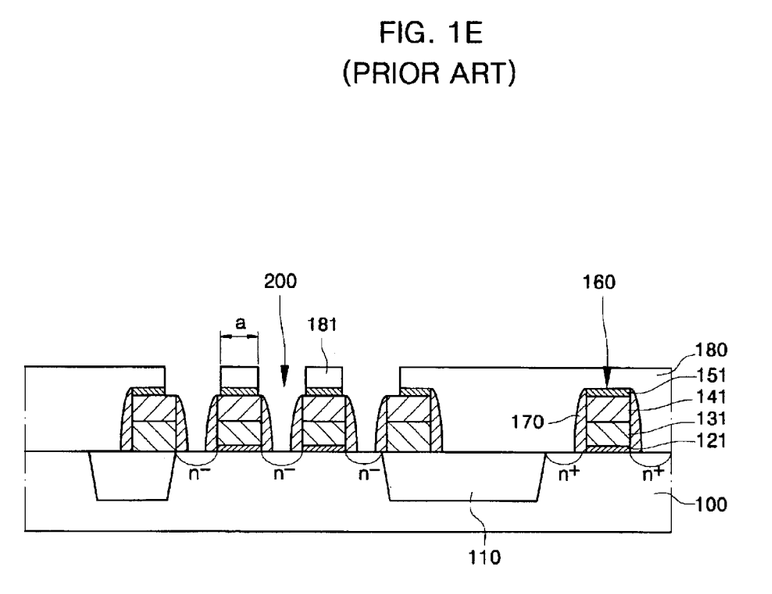

Referring to FIG. 1E, the interlayer dielectric 180 is etched using the photoresist pattern 191 as an etching mask to form an interlayer dielectric pattern 181, while exposing the substrate between the gate patterns 160. That is, the source/drain region between the gate patterns 160 is exposed to form a self-aligned contact hole 200. The etching of the interlayer dielectric is performed using a mixed gas including a gas having a high carbon/fluorine ratio, such as $C_3F_8$, $C_4F_8$, CO, or the like and by using an etching apparatus having a high ionization degree.

Then, a conductive material is deposited on the substrate 100, on which the interlayer dielectric pattern 181 including the contact hole 200 are formed, to form a contact or a storage node (not shown).

After completing the formation of the contact hole by the anisotropic etching, a cleaning process is performed so that a subsequently deposited conductive material is able to form an ohmic contact with the substrate. This cleaning process is carried out to remove contaminants present on the substrate such as organic materials, particles, and the like and to remove a native oxide formed on the substrate. The native oxide is an oxide layer naturally formed during the exposure of the substrate to the atmosphere.

As the integration degree of the semiconductor devices increases and as the design rule decreases, the interlayer dielectric is required to have greater gap filling characteristics. In addition, the margin required for accomplishing an insulated state between the patterns is gradually reduced. Generally, BPSG is used for the formation of the interlayer dielectric after forming the gate. When forming the self-aligned contact (SAC) for connecting DC (direct contact) and BC (buried contact), the distance between adjacent contact holes is too narrow and a cleaning is not sufficiently performed before the deposition of a conductive material, such as polysilicon, for forming a pad. During cleaning, the interlayer dielectric as well as the impurities are also etched by a cleaning solution. When the concentration of boron and phosphorus is high in the BPSG (borophosphorous silicate glass), a high reflowing property is obtained and the gap filling characteristic is improved. However, since the etching characteristic of the cleaning solution is also improved, the concentration of boron and phosphorus is not able to be sufficiently increased.

As a result, the size of the interlayer dielectric pattern represented by distance "a" in FIG. 1E decreases, and the interlayer dielectric pattern might be lost by overetching of the interlayer dielectric layer pattern during cleaning, thereby subsequently generating a bridge. Accordingly, a sufficient cleaning is not able to be performed in view of the above-described problem and so a defect, such as a single bit failure, may be created.

For cleaning a contact hole during the manufacture of a semiconductor device, various methods of removing organic materials and inorganic materials, such as metallic residues including a native oxide layer, an oxide layer, contaminants, and the like are combined. Atypical conventional cleaning method winnow be described.

First, the substrate is cleaned using piranha, which is a sulfuric acid solution obtained by mixing sulfuric acid and hydrogen peroxide or standard cleaning solution-1 (SC-1), which is an ammonia solution obtained by mixing aqueous ammonia, hydrogen peroxide and pure water. Through this cleaning, particles and organic materials are removed. Then, the substrate is rinsed using a quick dump rinse (QDR) method.

Second, the substrate is cleaned using a hydrogen fluoride-containing solution or a buffered oxide etching (BOE) solution to remove the oxide layer and then rinsed using de-ionized water and by applying an over-flowing method.

Third, the substrate is cleaned using a hydrochloric acid solution obtained by mixing hydrochloric acid, hydrogen peroxide and pure water, to remove inorganic materials. Recently, this third step of the cleaning may be omitted in some instances as the purity of the chemicals used has improved. After completing the cleaning, the substrate is dried using a dryer.

Disadvantageously, a large amount of chemicals are consumed in the conventional cleaning process as described above and the cleaning requires a long time. In addition, as the size of a wafer increases, the size of the cleaning apparatus must also increase, which then occupies a large area within a cleaning room, thereby lowering productivity.

Further, according to the conventional cleaning method of the contact hole, a native oxide layer grows in the chemical material to a thickness of about 10 Å because the organic and inorganic material present on the surface of the contact hole is removed using a sulfuric acid solution at a high temperature of about 130° C. Therefore, the performance time for the cleaning process to remove the native oxide through dipping into the hydrogen fluoride solution or BOE solution should be increased. As a result of this increase in dipping time, the loss of the interlayer dielectric layer pattern formed as the sidewalls of the contact hole becomes severe.

An electric insulation might be broken between a first polysilicon layer for a gate electrode and a second polysilicon layer for a bit line, between a first polysilicon layer for a gate electrode and a third polysilicon layer for a storage node, and between a second polysilicon layer for a bit line and a third polysilicon layer for a storage electrode, thereby deteriorating device characteristics.

Recently, after removing the organic and inorganic material, a diluted HF (DHF) solution has been widely used to completely remove the native oxide layer in a short time and to minimize the loss of the sidewall forming the contact hole. The DHF solution is a cleaning solution obtained by mixing water and hydrogen fluoride in a mixing ratio of about 200:1 by volume. The DHF solution is effective for removing the native oxide formed on a bottom portion of the contact hole and particles present in the contact hole. However, since the DHF solution also has a high etching selectivity with respect to BPSG, an application of a DHF solution in the manufacture of a minute device is not advantageous.

Figure 2:
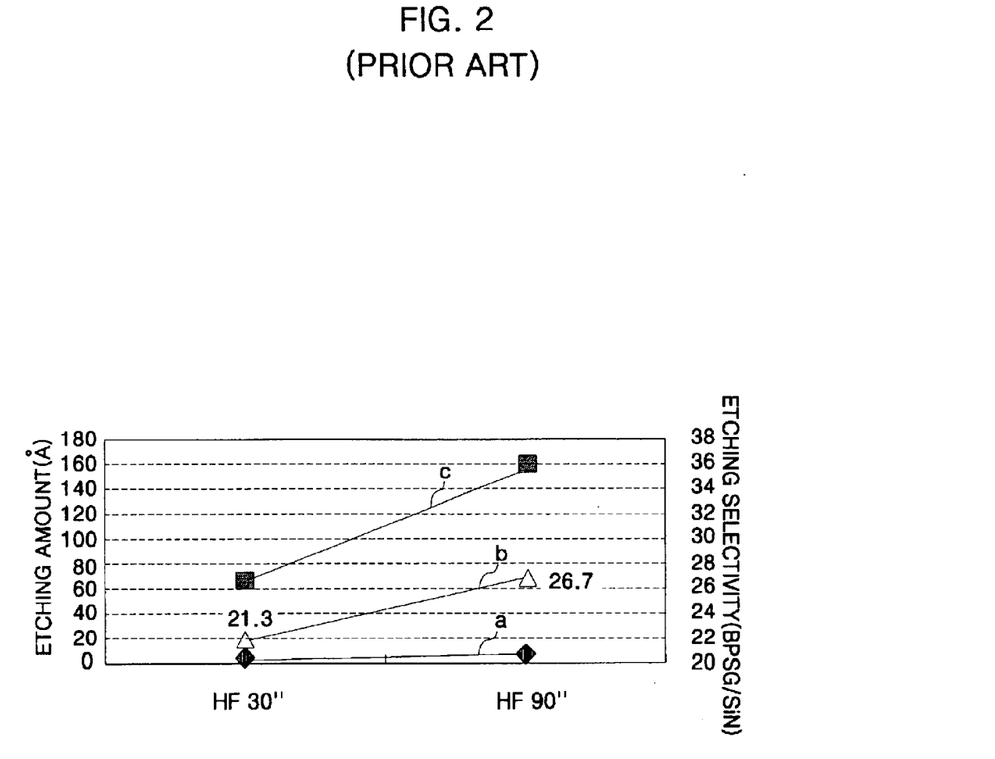
FIG. 2 is a graph for illustrating an etching amount of SiN and BPSG and an etching ratio between SiN and BPSG during performance of a cleaning process using a diluted HF solution after the formation of a contact hole.

FIG. 2 is a graph illustrating an etching amount (i.e., an etched amount) of SiN and BPSG and an etching ratio between SiN and BPSG during the performance of a cleaning process using a DHF solution after the formation of a contact hole. Line a represents an etched amount of SiN, line c represents an etched amount of BPSG and line b represents an etching ratio of BPSG/SiN.

Referring to FIG. 2, the etching amounts of both SiN and BPSG increase when cleaning time increases. However, the etching amount of BPSG increases at an even higher ratio than SiN. Further, when comparing the etching amount of BPSG with SiN, BPSG is etched faster than SiN by about 21.3–26.7 times. Through this analysis, it may be determined that the BPSG forming the interlayer dielectric is excessively etched by a hydrogen fluoride cleaning solution.

SUMMARY OF THE INVENTION

The present invention has been made in an effort to solve the aforementioned problems, and a feature of an embodiment of the present invention is to provide a method of forming a contact hole of a semiconductor device that is able to prevent excessive etching of an interlayer dielectric material, such as BPSG.

Another feature of an embodiment of the present invention is to provide a method of forming a contact hole using a cleaning solution, which is able to inhibit excessive etching of an interlayer dielectric pattern to prevent a generation of a defect.

To provide the above feature, there is provided in the present invention a method of forming a contact hole of a semiconductor device including forming a gate pattern including a first insulation layer pattern, a conductive layer pattern, a capping insulation layer pattern, and a second insulation layer pattern on a substrate; forming a spacer using an insulating material on a sidewall of the gate pattern; forming an interlayer dielectric on the substrate on which the gate pattern and the spacer are formed; forming a contact hole and an interlayer dielectric pattern for exposing the substrate by etching the interlayer dielectric; forming a liner spacer on a sidewall of the spacer and the interlayer dielectric pattern; and cleaning the resultant structure using a cleaning solution.

Preferably, forming the liner spacer includes forming a liner layer by depositing a liner material on the substrate on which the contact hole and the interlayer dielectric pattern are formed; and performing an etch-back process. The liner spacer may include a nitride or an oxide. The preferred nitride is SiN and the preferred oxide is HTO (hot temperature oxide). Preferably, the liner material is deposited to a thickness of about 70–85 Å.

The liner spacer may be removed by the cleaning and an ion implantation process may be further implemented onto an exposed substrate after forming the liner spacer.

The cleaning solution applied after forming the contact hole preferably includes ozone water and hydrogen fluoride (HF). In particular, the ozone water preferably includes ozone in a concentration of about 1–100 ppm and hydrogen fluoride is preferably a diluted hydrogen fluoride solution in water having a concentration of about 50%. More preferably, a cleaning solution including both of the ozone water and hydrogen fluoride in a mixing ratio of about 50:1–2000:1 by volume is used. Further, it is preferable that an etching selectivity of the cleaning solution onto BPSG with respect to SiN is about 5 or less.

The cleaning may be performed by repeating, one to three times, a cycle of applying a first cleaning solution including ozone water and a second cleaning solution including hydrogen fluoride (HF). At this time, the final step of the cleaning is preferably performed using the second cleaning solution including hydrogen fluoride.

Preferably, the interlayer dielectric comprises at least one material selected from the group consisting of BPSG (borophosphorous silicate glass), PSG (phosphorous silicate glass), TEOS (tetraethyl ortho silicate) and HDP (high density plasma) oxide.

The above feature of an embodiment of the present invention may also be provided by a method of forming a contact hole of a semiconductor device including forming a gate pattern including a first insulation layer pattern, a conductive layer pattern, a capping insulation layer pattern, and a second insulation layer pattern on a substrate; forming a spacer using an insulating material on a sidewall of the gate pattern; forming an interlayer dielectric on a first resultant structure; forming a contact hole and an interlayer dielectric pattern for exposing the substrate by etching the interlayer dielectric using a predetermined mask; and cleaning a second resultant structure using a cleaning solution including ozone water and hydrogen fluoride (HF).

According to the present invention, a minute contact hole is formed in an interlayer dielectric and then a liner layer is formed to prevent an etching of an interlayer dielectric pattern during a subsequent cleaning process. Alternately, sufficient cleaning of a contact hole is performed using a mixed solution of ozone water and hydrogen fluoride without generating any damage to an interlayer dielectric pattern formed between adjacent contact holes.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Korean Patent Application No. 2002-39816, filed on Jul. 9, 2002, and entitled: "Method of Forming a Contact Hole of a Semiconductor Device," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

FIGS. 3A to 3E illustrate cross-sectional views of stages in a method of forming a contact hole of a semiconductor device according to a preferred embodiment of the present invention. The following embodiment is illustrated as a BC process and incorporates similar process steps as described in connection with FIGS. 1A–1C.

Figure 3A:
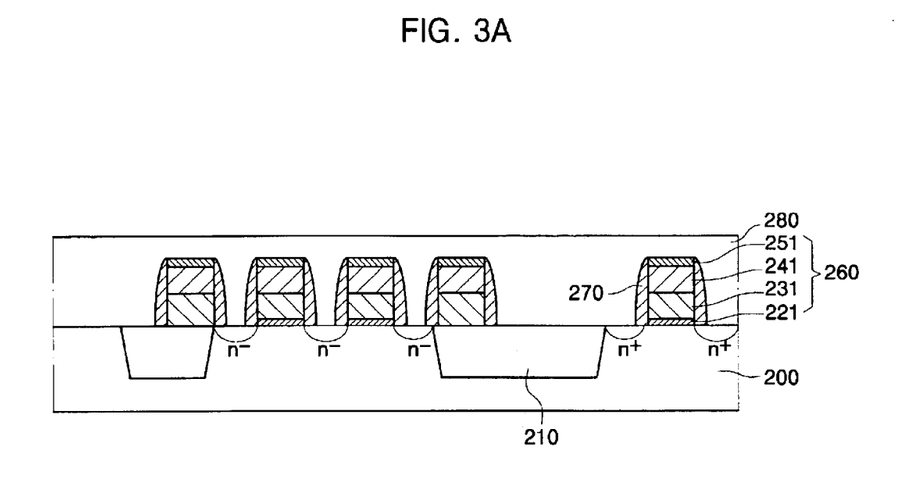
FIGS. 3A to 3E illustrate cross-sectional views of stages in a method of forming a contact hole of a semiconductor device according to a preferred embodiment of the present invention.

Referring to FIG. 3A, gate patterns 260 are formed on a semiconductor substrate 200 that is divided into an active region and a field region by a field oxide layer 210. A spacer is formed on the sidewall portion of the gate pattern 260 by the method described with reference to FIGS. 1A–1C.

The gate patterns 260 are formed to have a predetermined gap therebetween on a predetermined region of a substrate by continuously patterning integrated layers of a second oxide layer, a capping insulation layer, a conductive layer and a first oxide layer. Each of the gate patterns 260 includes subsequently integrated layer patterns of a first insulation layer pattern 221, a conductive layer pattern 231, a capping insulation layer pattern 241 and a second insulation layer pattern 251. Each of the gate patterns 260 corresponds to each gate electrode. Preferably, the first insulation layer pattern 221 and the second insulation layer pattern 251 are oxide patterns.

In order to form the spacer 270, silicon nitride is deposited on the entire surface of the substrate to form a silicon nitride layer (not shown) as an insulation layer. Then, an etch-back process is performed on the silicon nitride layer until the active region of the semiconductor substrate 200 is exposed.

During the etching to form the spacer 270, a surface portion of the semiconductor substrate becomes damaged. To cure the etching damage, a thermal oxidation is performed at a predetermined temperature. At this time, a thin thermal oxide layer grows between the gate patterns 260 and on the surface of the semiconductor substrate 200. This thin thermal oxide layer is called an MTO.

Subsequently, an ion implantation process is performed to form a source/drain region (not shown) between gate patterns 260 and onto the semiconductor substrate 200 using the thin thermal oxide layer as a screen oxide layer. In order to perform the ion implantation, a region is masked to implant appropriate impurities into a desired region of the substrate 200. Then, the impurities are implanted into the active region of the exposed semiconductor substrate 200 and a diffusion region of the source/drain of a transistor is formed. During the ion implantation, the gate pattern 260 and the spacer 270 formed at the sidewall of the gate pattern 260 function as a mask. Alternatively, the ion implantation may be performed at a later stage in the process, i.e., after formation of a liner spacer, as will be subsequently described.

Thereafter, an interlayer dielectric 280 is formed on the semiconductor substrate 200 on which the gate pattern 260 and the spacer 270 are formed. The interlayer dielectric 280 is formed by depositing materials having a good gap filling characteristic such as silicon oxide, BPSG (borophosphorous silicate glass), PSG (phosphorous silicate glass), HDP (high density plasma) oxide, TEOS (tetraethyl ortho silicate), or the like by a LPCVD method or a PE-CVD method. Then, the deposited material is planarized by a planarizing method, such as CMP. Next, a photoresist pattern (not shown) having a predetermined shape for patterning the interlayer dielectric to form a contact hole is formed.

Figure 3B:
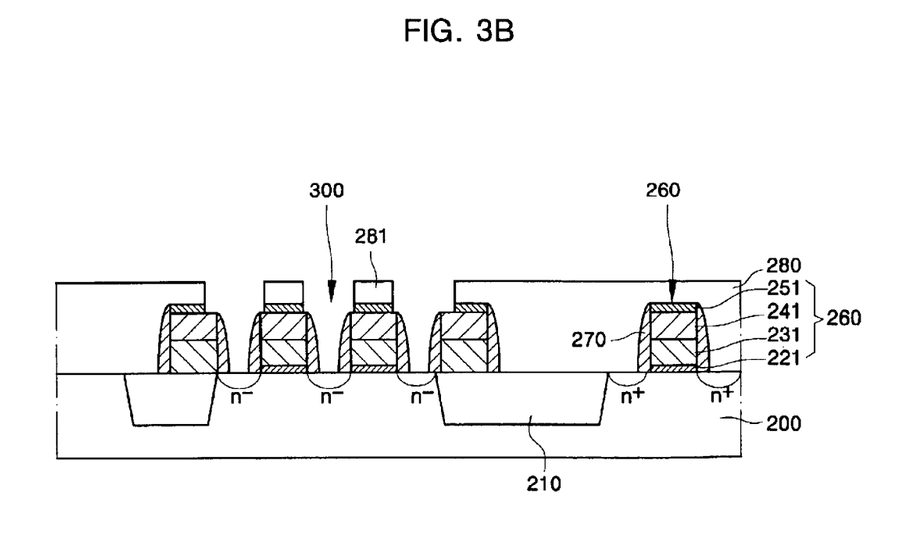

Referring to FIG. 3B, the interlayer dielectric 280 is etched using the photoresist pattern as an etching mask to form an interlayer dielectric pattern 281, while exposing the substrate between the gate patterns 260. That is, the source/drain region between the gate patterns 260 is exposed to form a self-aligned contact hole 300. The etching of the interlayer dielectric is performed using a mixed gas including a gas that has a high carbon/fluorine ratio, such as $C_3F_8$, $C_4F_8$, CO, or the like and by using an etching apparatus having a high ionization degree.

During the etching to form the contact hole 300, a surface portion of the semiconductor substrate is damaged. To cure the etching damage, a thermal oxidation is applied at a predetermined temperature. At this time, a thin thermal oxide layer grows between the spacers 270 and on the surface of the semiconductor substrate 200. This thin thermal oxide layer is called an MTO.

Figure 3C:
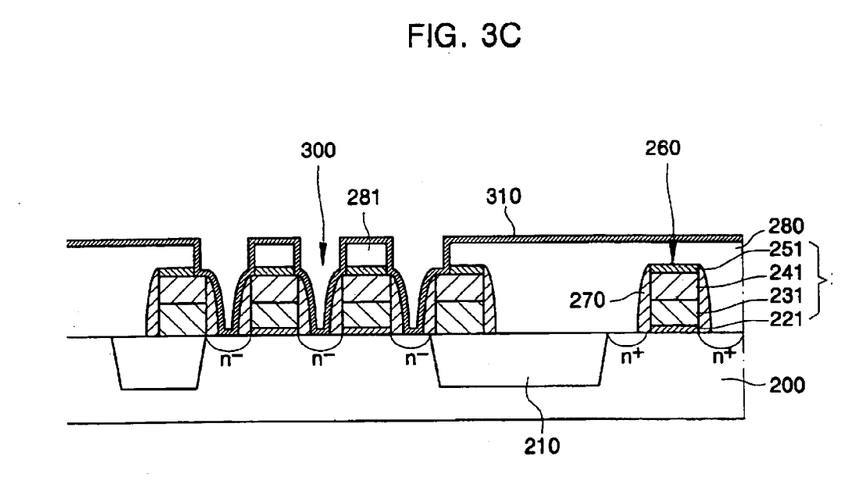

Referring to FIG. 3C, silicon nitride is preferably deposited on the entire surface of the substrate on which the interlayer dielectric pattern 281 and the contact hole 300 are formed to a thickness of about 70–85 Å, preferably about 78 Å, by means of an LPCVD method to form a liner layer 310. Alternately, the liner layer may be a nitride or an oxide. Preferably, the nitride is silicon nitride and the oxide is a hot temperature oxide (HTO).

Figure 3D:
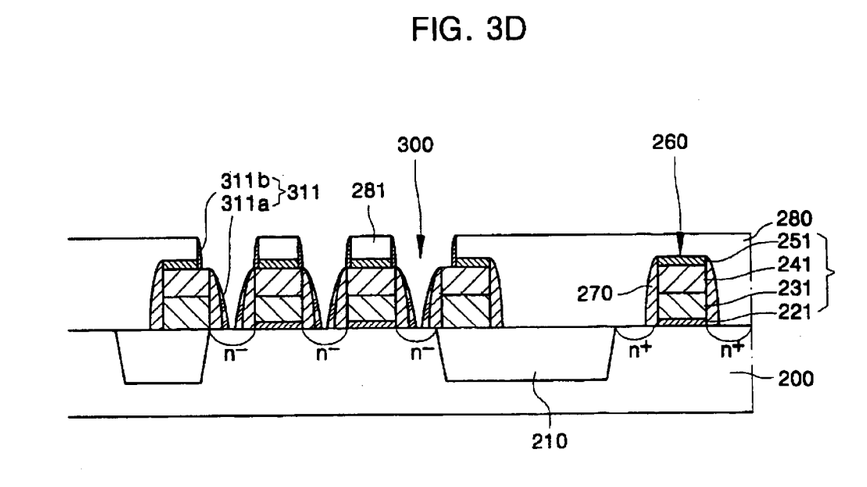

Referring to FIG. 3D, an etch-back process is performed on the liner layer 310 to form liner spacers 311a and 311b of SiN on the sidewall portion of the spacer 270 and the interlayer dielectric pattern 281, respectively. Through the etch-back process, the MTO is also removed.

According to a preferred embodiment of the present invention, the etching amount of the interlayer dielectric pattern 281 during subsequent cleaning process may be reduced by forming the liner spacer 311 after forming the contact hole 300 and the interlayer dielectric pattern 281. Further, other advantages are obtained from the formation of the liner spacer. Specifically, the liner spacer 311a formed on the sidewall portion of the spacer 270 narrows an exposed area of the substrate between the spacers 270. After forming the spacer 270, an ion implantation may be performed to reduce a contact resistance of a subsequently deposited conductive material with the substrate. That is, the ion implantation is performed before formation of a plug. In an alternate embodiment, as mentioned above, this ion implantation may be performed after the formation of the liner spacer 311. In this case, the ions will be implanted onto a narrowed region, thus a diffusion region within a designated region is advantageously formed. Therefore, a device having an improved quality can be formed when the ion implantation is performed after the formation of the liner spacer.

A cleaning process may then be carried out without performing the etch-back process onto the liner layer, however, the etch-back process is preferably carried out to form the liner spacer and for removing the MTO and exposing the substrate for the ion implantation.

Figure 3E:
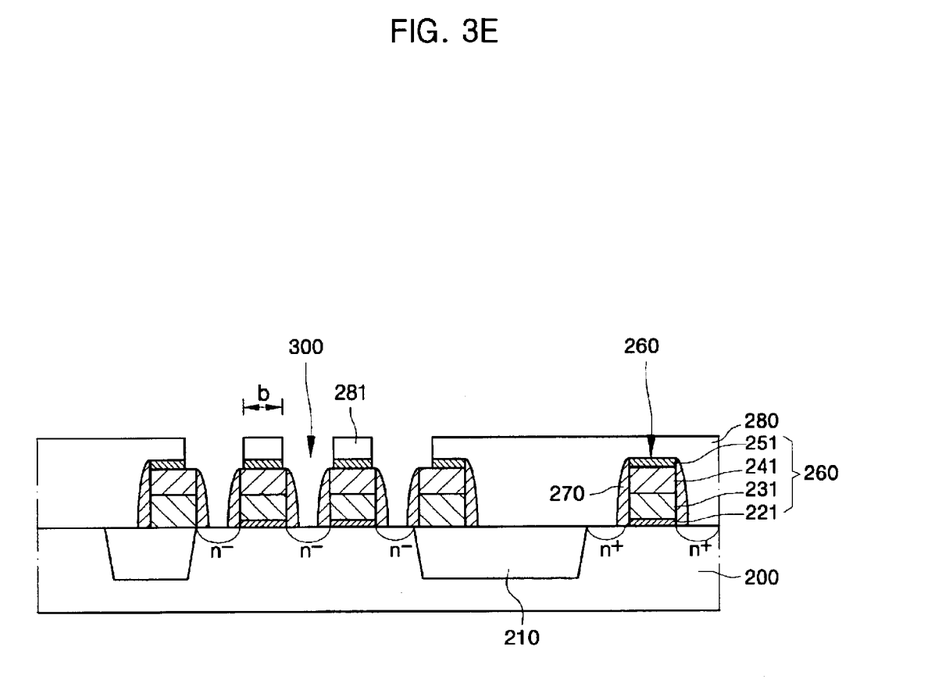

Referring to FIG. 3E, a cleaning process of the contact hole using a cleaning solution is carried out. The cleaning process removes organic materials, metallic impurities, native oxide, and the like. In addition, the liner spacers 311a and 311b formed on the sidewall portion of the spacer 270 and the interlayer dielectric pattern 281, respectively, are removed. The cleaning is a type of wet etching. For the cleaning, the device is dipped into the cleaning solution and an isotropic etching occurs. During the cleaning, the liner spacer 311b formed on the sidewall portion of the interlayer dielectric pattern 281 is also removed. Thus, the interlayer dielectric pattern is protected and the distance designated by "b" can be advantageously maintained. According to this method, the cleaning at the bottom portion of the contact hole, that is, at the surface of the substrate, is improved, while the etching of the interlayer dielectric pattern is minimized. The dipping time of the device into the cleaning solution is determined by observation of the removal of the liner spacer. From the result of this observation, an end point of the cleaning is determined to control the dipping time.

Subsequently, a conductive material is deposited onto the entire surface of the substrate 200 on which the interlayer dielectric pattern 281 including the contact hole 300 is formed to form a contact or a storage node (not shown).

After completing the formation of the contact hole by means of an anisotropic etching and forming the liner spacer, the cleaning process is performed to facilitate an ohmic contact. Then, contaminants such as organic materials, particles, and the like are removed and the native oxide formed on the substrate is also removed.

As for the cleaning solution, the conventionally used hydrogen fluoride cleaning solution, that is, a mixed solution of water and hydrogen fluoride in a mixing ratio of about 200:1 by volume, can be used in the case where the liner spacer has been formed. It is preferred, however, that even if the liner spacer is formed a mixed solution including ozone water with hydrogen fluoride is used as the cleaning solution.

The preferred cleaning solution used in connection with an embodiment of the present invention includes ozone water and hydrogen fluoride (HF). The preferred ozone water includes ozone in a concentration of about 1–100 ppm and hydrogen fluoride is preferably used as a diluted hydrogen fluoride in water with a concentration of about 50%. Moreover, the preferred mixing ratio of the ozone water and hydrogen fluoride is in a range of about 50:1–2000:1 by volume. An etching selectivity of the prepared cleaning solution onto BPSG with respect to SiN is about 5 or less. Therefore, excessive etching of the interlayer dielectric pattern is prevented during the cleaning process.

Among the components of the cleaning solution, ozone has a good ability to remove contaminants present on a surface of a substrate. Particularly, organic materials and metallic oxides are advantageously removed. Ozone is a strong oxidizing agent and has an affinity to environments. However, penetration of ozone into the substrate is difficult. On the contrary, hydrogen fluoride etches silicon and oxides thereof to remove silicon without difficulty. Accordingly, a mixture obtained by the combining two compounds is able to advantageously remove various kinds of contaminants.

Removal of organic materials by ozone is considered through an oxidation and decomposition process using active radicals produced through a decomposition of ozone and a direct reaction of ozone with the organic materials. The production of the active radicals from ozone is accomplished by the following reactions.

$$O_3 + OH^- \rightarrow O_2^- + HO_2^+ \tag{1}$$

$$O_3 + HO_2^+ \rightarrow 2O_2 + OH^+ \tag{2}$$

$$O_3 + OH^+ \rightarrow O_2 + HO^+ \tag{3}$$

$$2HO_2^+ \rightarrow O_3 + H_2O \tag{4}$$

$$HO_2^+ + OH^+ \rightarrow O_2 + H_2O \tag{5}$$

The decomposition of the organic materials through the decomposition reaction by ozone occurs following the reaction mechanism below.

$$O_3 + \text{organic material (polymer)} \rightarrow CO_2 + H_2O \tag{6}$$

In addition, surface oxidation reactions by the oxidation of ozone and an oxide etching reaction by hydrogen fluoride occur as follows.

$$O_3 + M(\text{surface}) \rightarrow MO_x + O_2 \tag{7}$$

$$SiO_2 + 6HF \rightarrow H_2SiF_6 + 2HO_2 \tag{8}$$

In the cleaning process, a layer-by-layer oxidation/etching reaction is accomplished and various types of contaminants are advantageously removed.

According to another embodiment of the present invention, the cleaning solution may actually comprise two separate cleaning solutions. More specifically, a first cleaning solution including ozone water and a second cleaning solution including hydrogen fluoride may be alternately applied to perform the cleaning process. When one application of each of the two cleaning solutions is set as one cycle, the cleaning process is accomplished by repeating the cycle between one and three times. Treatment using the second cleaning solution, including hydrogen fluoride, is preferably the final step of the cleaning. When the final step is performed using the hydrogen fluoride cleaning solution, the substrate becomes hydrophobic, however, when the final step is performed using the ozone water cleaning solution, the substrate becomes hydrophilic. When considering subsequently deposited polysilicon for forming a pad, a hydrophobic substrate is preferable. Further, the final step is preferably performed using the hydrogen fluoride cleaning solution to remove a native oxide layer or a chemically formed oxide layer.

The ozone water applicable for the preparation of the cleaning solution used in the present invention may be produced by various methods. In the present invention, the following exemplary apparatus for preparing ozone water using an electrolytic analysis system was used.

Figure 4:
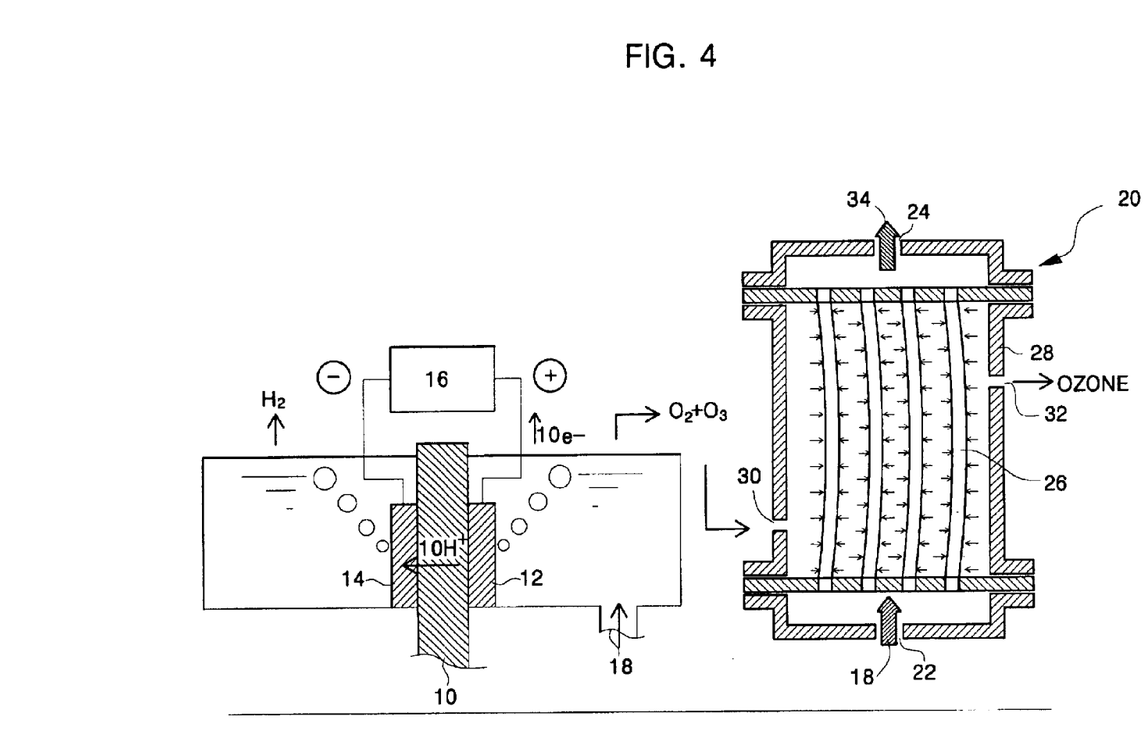
FIG. 4 is a schematic diagram of an apparatus of preparing ozone water by an electrolytic analysis.

FIG. 4 is a schematic diagram of an apparatus for preparing ozone water by an electrolytic analysis. First, ozone is produced by an electrolytic analysis of pure water. At both sides of a solid polymer electrolyte 10, a positive electrode 12 and a negative electrode 14 are provided. When a direct current source 16 is connected to the electrodes, pure water 18 is electrolytically analyzed. At the positive electrode 12, the following reactions described by equations (9) and (10) occur to produce oxygen gas and ozone gas. At the negative electrode 14, the following reaction described in equation (11) occurs to produce hydrogen gas.

$$2H_2O \rightarrow O_2 + 4H^+ + 4e^- \quad (9)$$

$$3H_2O \rightarrow O_3 + 6H^+ + 6e^- \quad (10)$$

$$10H^+ + 10e^- \rightarrow 5H_2 \quad (11)$$

Thus produced oxygen gas and ozone gas are introduced into an apparatus of preparing ozone water 20. The apparatus of preparing ozone water 20 includes a plurality of hollow membrane filters 26 into which pure water 18 is injected through a liquid injecting portion 22 and a chamber 28. Through an air injecting portion 30 formed at one side of the chamber 28, oxygen gas and ozone gas are injected. A portion of the gas injected into the chamber 28 is dissolved into pure water flowing within the plurality of hollow membrane filters 26, and the remaining injected gas is exhausted out through an exhausting portion 32. Ozone water 34 is exhausted out through a liquid exhausting portion 24. The ozone water used for the preparation of the cleaning solution of the present invention preferably includes ozone in a concentration range of about 1–100 ppm. When the concentration of ozone is less than 1 ppm, a sufficient cleaning is difficult to accomplish and when the concentration of ozone exceeds 100 ppm, a defect due to excessive etching is generated. Accordingly, ozone water having an appropriate ozone concentration should be prepared by monitoring the concentration of ozone.

As described above, the cleaning process may be performed by alternately applying a prepared ozone water and hydrogen fluoride cleaning after forming the liner spacer, or it may be performed by applying a mixed cleaning solution of ozone water and diluted hydrogen fluoride in water having a concentration of about 50%, in a mixing ratio of about 50:1–2000:1 by volume.

Figure 5:
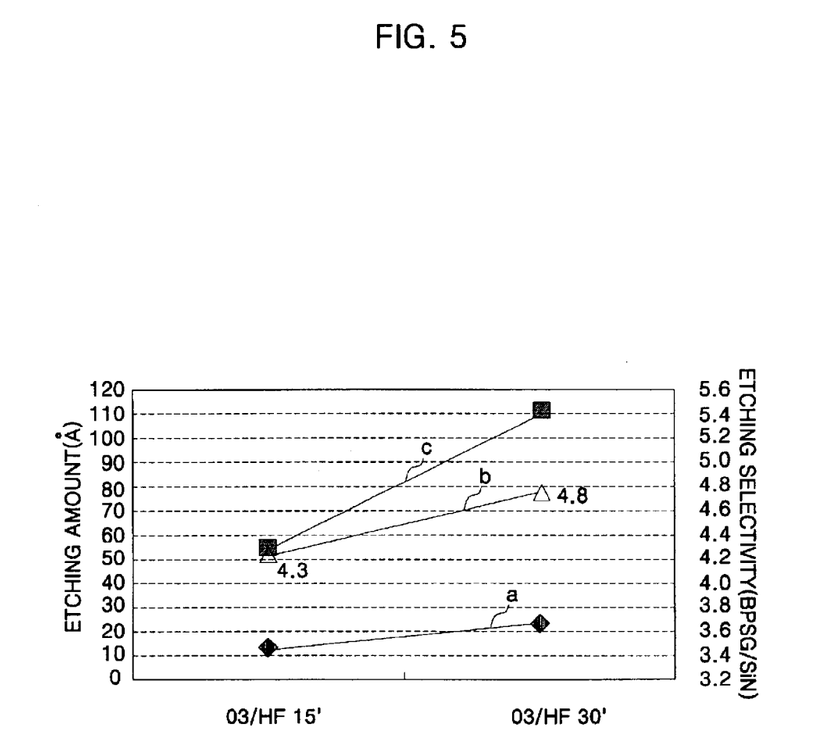
FIG. 5 is a graph for illustrating an etching amount of SiN and BPSG and an etching ratio between SiN and BPSG during the performance of a cleaning process according to an embodiment of the present invention using a mixed solution of ozone-water and a diluted HF solution after the formation of a contact hole.

FIG. 5 is a graph for illustrating an etching amount (i.e., an etched amount) of SiN and BPSG and an etching ratio between the two during performance of a cleaning process using a mixed solution of ozone-water and a diluted HF solution after forming a contact hole. In FIG. 5, line a represents an etching amount of SiN, line c represents an etching amount of BPSG and line b represents an etching ratio of BPSG/SiN.

Referring to FIG. 5, the etching selectivity of the cleaning solution of the present invention onto BPSG is still higher as compared to SiN. However, the etching selectivity is about 4.3–4.8 and FIG. 5 shows a much lower etching ratio of BPSG as comparing to the result illustrated in FIG. 2.

Excessive etching of the interlayer dielectric pattern may be prevented through formation of a liner spacer and/or use a newly prepared cleaning solution according to an embodiment of the present invention. The method of forming a contact hole of the present invention has been explained with reference to a method for forming BC, however, the present invention can be applied to various methods of forming a contact hole including BC, DC, and the like without exception.

As described above, the etching of the interlayer dielectric pattern during cleaning process may be prevented when a liner spacer is formed on the sidewall portion of a spacer and an interlayer dielectric after formation of a contact hole, according to the present invention. Accordingly, a sufficient cleaning may be accomplished before depositing a conductive layer. In addition, a generation of a bridge due to a narrow gap between adjacent contact holes during the manufacturing of a minute device may be reduced to decrease a generation of a device defect.

Further, since the cleaning solution applied after the formation of a contact hole includes ozone water and aqueous hydrogen fluoride, contaminating materials and oxides may be effectively removed, while lowering the etching selectivity onto BPSG. Accordingly, the loss of the interlayer dielectric made of BPSG during the cleaning is prevented and a reduction of a contact resistance and an improvement of a refresh characteristic may be achieved.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a contact hole of a semiconductor device comprising:

forming a gate pattern, including a first insulation layer pattern, a conductive layer pattern, a capping insulation layer pattern, and a second insulation layer pattern, on a substrate;

forming a spacer using an insulating material on a sidewall of the gate pattern;

forming an interlayer dielectric on the substrate on which the gate pattern and the spacer are formed;

forming a contact hole and an interlayer dielectric pattern for exposing the substrate by etching the interlayer dielectric;

forming a liner spacer of an oxide or a nitride on a sidewall of the spacer and the interlayer dielectric pattern; and cleaning a resultant structure using a cleaning solution, wherein the liner spacer is removed by the cleaning.

2. A method of forming a contact hole of a semiconductor device as claimed in claim 1, wherein forming the liner spacer comprises:

forming a liner layer by depositing a liner material on the substrate on which the contact hole and the interlayer dielectric pattern are formed; and performing an etch-back process.

3. A method of forming a contact hole of a semiconductor device as claimed in claim 2, wherein the liner material is deposited to a thickness of about 70–85 Å.

4. A method of forming a contact hole of a semiconductor device as claimed in claim 1, wherein the nitride is SiN and the oxide is HTO (hot temperature oxide).

5. A method of forming a contact hole of a semiconductor device as claimed in claim 1, further comprising:

performing an ion implantation process on an exposed portion of the substrate after forming the liner spacer and before the cleaning.

6. A method of forming a contact hole of a semiconductor device as claimed in claim 1, wherein the cleaning solution includes ozone water and hydrogen fluoride (HF).

7. A method of forming a contact hole of a semiconductor device as claimed in claim 6, wherein the ozone water includes ozone in a concentration of about 1–100 ppm.

8. A method of forming a contact hole of a semiconductor device as claimed in claim 6, wherein the hydrogen fluoride is a diluted hydrogen fluoride solution in water with a concentration of about 50%.

9. A method of forming a contact hole of a semiconductor device as claimed in claim 6, wherein the cleaning solution includes the ozone water and the hydrogen fluoride in a mixing ratio of about 50:1–2000:1 by volume.

10. A method of forming a contact hole of a semiconductor device as claimed in claim 6, wherein the liner spacer is formed of SiN and the interlayer dielectric is formed of BPSG; and an etching selectivity of the cleaning solution onto BPSG with respect to SiN is about 5 or less.

11. A method of forming a contact hole of a semiconductor device as claimed in claim 1, wherein the cleaning is performed by repeating, one to three times, a cycle of applying a first cleaning solution including ozone water and a second cleaning solution including hydrogen fluoride (HF).

12. A method of forming a contact hole of a semiconductor device as claimed in claim 4, wherein a final step of the cleaning is performed using the second cleaning solution.

13. A method of forming a contact hole of a semiconductor device as claimed in claim 1, wherein the interlayer dielectric comprises at least one material selected from the group consisting of BPSG (borophosphorous silicate glass), PSG (phosphorous silicate glass), TEOS (tetraethyl ortho silicate) and HDP (high density plasma) oxide.

* * * * *